United States Patent
Staver et al.

(10) Patent No.: US 8,319,509 B1
(45) Date of Patent: Nov. 27, 2012

(54) TESTING CIRCUIT FOR AN ANALOG TO DIGITAL CONVERTER

(75) Inventors: Daniel Arthur Staver, Colorado Springs, CO (US); Jean-Jacques Kazazian, Porcieux (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/460,006

(22) Filed: Apr. 30, 2012

(51) Int. Cl.
*G01R 31/00* (2006.01)

(52) U.S. Cl. .................................. 324/750.01

(58) Field of Classification Search ............. 324/750.01, 324/750.3, 762.01, 99 D, 140 R, 141, 142, 324/126; 341/120–121; 702/108
See application file for complete search history.

(56) References Cited

U.S. PATENT DOCUMENTS

| | | | |
|---|---|---|---|
| 5,673,196 A | 9/1997 | Hoffman et al. | |
| 5,712,633 A * | 1/1998 | Bae | 341/120 |
| 6,262,672 B1 | 7/2001 | Brooksby et al. | |
| 2005/0212505 A1* | 9/2005 | Murray et al. | 324/126 |
| 2010/0103006 A1* | 4/2010 | Miyake et al. | 341/120 |

* cited by examiner

*Primary Examiner* — Arleen M Vazquez
(74) *Attorney, Agent, or Firm* — Fish & Richardson P.C.

(57) ABSTRACT

A testing circuit configures an analog to digital converter (ADC) to receive a test signal instead of a live input signal. The testing circuit compares an output test value from the ADC to an expected test value for the test signal. The testing circuit provides an expected live output value to a digital circuit instead of the output test value, thereby preventing the ADC from providing a value to the digital circuit not based on the live input signal.

18 Claims, 3 Drawing Sheets

US 8,319,509 B1

TESTING CIRCUIT FOR AN ANALOG TO DIGITAL CONVERTER

TECHNICAL FIELD

This disclosure relates generally to electronics and more particularly to analog to digital converters.

BACKGROUND

An analog to digital converter (ADC) is an electronic device that converts an input analog voltage or current to a digital value indicting the magnitude of the voltage or current. An ADC has a resolution indicating the number of discrete values it can produce over a range of analog values. ADCs are useful, for example, in electricity metering applications. Electricity meters can measure the amount of power consumed by a consumer on an electric utility grid.

ADCs in electricity meters and other applications sometimes operate in environments that are electrically and physically harsh. For example, high temperature swings, lightning strikes, high voltage power surges, and indirect nearby high current surges can damage an ADC. To test an ADC to ensure that it is still operating properly, the ADC can be taken off-line. In electricity metering applications, taking the electricity meter off-line can prevent revenue billing.

SUMMARY

A testing circuit can test an analog to digital converter (ADC). The testing circuit configures the ADC to receive a test signal instead of a live input signal. The testing circuit compares an output test value from the ADC to an expected test value for the test signal. The testing circuit provides an expected live output value to a digital circuit instead of the output test value, thereby preventing the ADC from providing a value to the digital circuit not based on the live input signal.

Particular implementations of the testing circuit can provide one or more of the following advantages: 1) the testing circuit can test an ADC without requiring an operator to reconfigure the ADC; 2) the testing circuit can test an ADC without interrupting an electricity meter measuring electric power consumption; and 3) the testing circuit can test an ADC while minimizing the disruption to an input signal by testing the input signal as its amplitude crosses zero.

The details of one or more disclosed implementations are set forth in the accompanying drawings and the description below. Other features, aspects, and advantages will become apparent from the description, the drawings and the claims.

DETAILED DESCRIPTION

Example Testing Circuit

Figure 1:
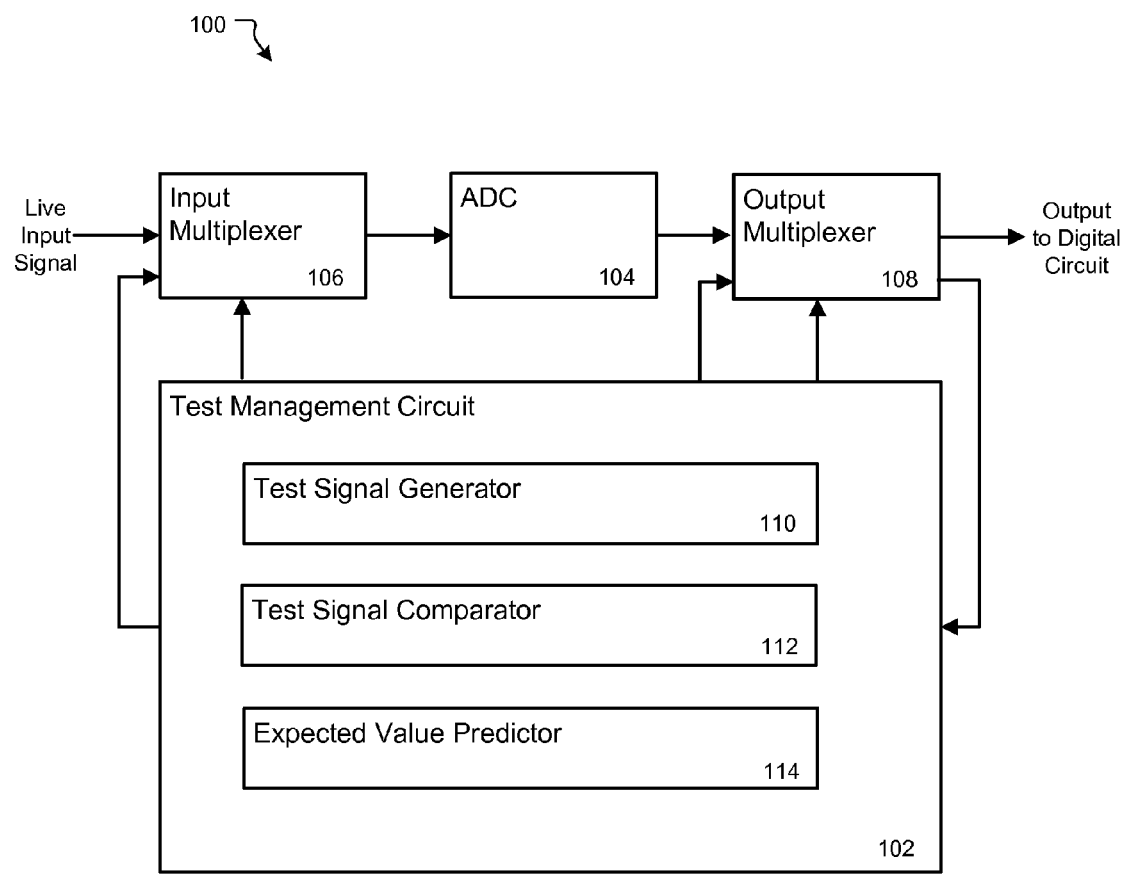
FIG. 1 is a schematic diagram of an example testing circuit for an analog to digital converter.

FIG. 1 is a schematic diagram of an example testing circuit 100 for an analog to digital converter (ADC) 104. The ADC receives as input a live input signal and provides a series of output digital values representing samples of the live input signal to a digital circuit. The testing circuit can test the ADC while the ADC continues to provide the series of output digital values.

The testing circuit determines an expected live output value of the ADC for a testing time period, takes the ADC off-line during the testing time period, and provides a test signal to the ADC during the testing time period. The testing circuit compares an output test value of the ADC to an expected test value for the test signal to determine whether the ADC is working properly. The testing circuit provides the expected live output value to the digital circuit during the testing time period. By providing the expected live output value, the ADC does not provide values to the digital circuit that are not based on the live input signal, even though the testing circuit takes the ADC off-line.

A test management circuit 102 takes the ADC off-line by configuring an input multiplexer 106 coupled to an input of the ADC and an output multiplexer 108 coupled to the output of the ADC. The test management circuit configures the ADC to receive either the live input signal or the test signal via a control input to the input multiplexer. The test management circuit configures the output multiplexer to provide the digital circuit with either an output digital value from the ADC or an expected live output value from the test management circuit.

The testing circuit includes a test signal generator 110 that is configured to generate the test signal. For example, the test signal generator can be a reference voltage supply circuit that can be implemented with a bandgap voltage reference. The test signal has an expected amplitude stored as an expected output value or range of expected output values in the testing circuit.

The testing circuit includes a test signal comparator 112 that is configured to compare a testing output value from the ADC to the expected output value for the test signal. The testing circuit can be implemented as a digital logic circuit or a software component. The testing circuit can determine whether the testing output value from the ADC is within the range of expected output values for the test signal. If the testing output value is within the range of the expected output values, the testing circuit determines that the ADC is working properly; if the testing output value is not within the range of the expected output value, the testing circuit determines that the ADC is not working properly.

The testing circuit includes an expected value predictor 114 that is configured to determine the expected live output value of the ADC. The expected value predictor can be implemented as a digital logic circuit or a software component. The testing circuit can perform any of various techniques to determine the expected live output value. The operation of the testing circuit does not depend on how the expected value predictor determines the expected live output value, as long as the expected live output value is based on the live input signal.

In some implementations, the expected value predictor stores digital output values from the ADC for the live input signal. The expected value predictor uses the stored values to determine the expected live output value.

For example, suppose that the live input signal is a voltage signal that varies between a positive voltage and a negative voltage at a live frequency. The frequency can change over time. The expected value predictor can determine the expected live output by voltage by assuming that the live input signal will continue varying at the live frequency through the testing time period.

The expected value predictor can apply an interpolation filter to the live input signal. Various techniques for applying interpolation filters are known in the art. In some implementations, the live input signal is band-limited or substantially band-limited to a maximum frequency. Using the maximum frequency, the expected value predictor and interpolation filter can be configured to determine a precise value for the expected live output. The testing circuit can sample the live input signal at a sampling frequency greater than or equal to twice the maximum frequency of the live input signal.

As another example, the expected value predictor can determine, based on the live frequency, a time when the voltage will be closest to zero or equal to zero as the voltage crosses from a positive value to a negative value or from a negative value to a positive value. Then, the expected value predictor determines that the expected live output value is closest to zero or equal to zero and that the testing time period encompasses the time when the voltage will be closest to zero or equal to zero.

It can be useful to use a testing time period encompassing a time when the voltage will be closest to zero or equal to zero, for example, because minimum power or no power will be drawn at that time. Nonetheless, the testing circuit can selected a testing time period when the live input signal is not expected to have an amplitude of zero.

Example Electricity Meter

Figure 2:
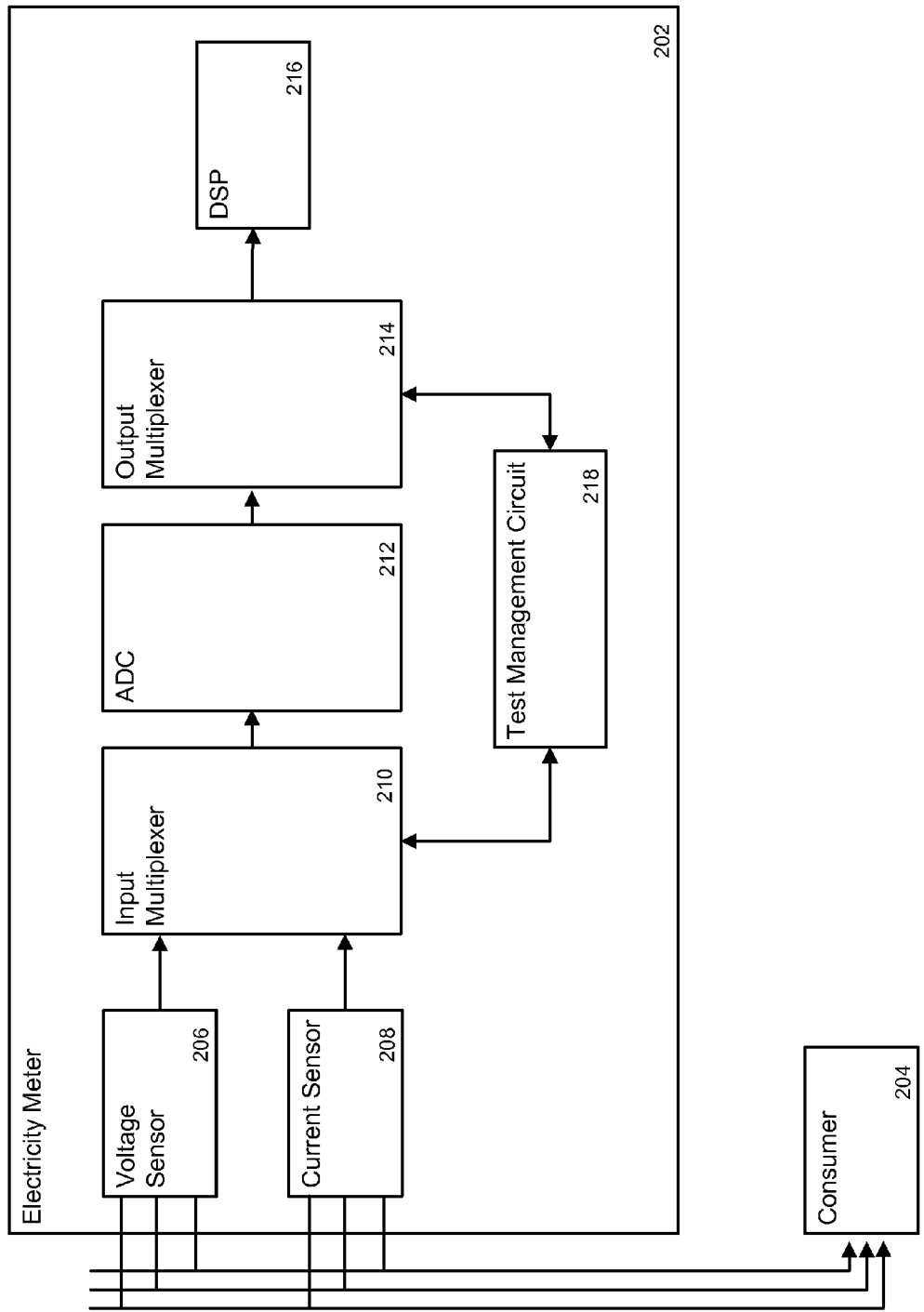
FIG. 2 is a schematic diagram of an example electricity meter.

FIG. 2 is a schematic diagram of an example electricity meter 200. The electricity meter is configured to measure electricity consumption of a consumer 204. The consumer can be, for example, a building or a residence.

The consumer is connected to an electric power grid that delivers three phase electric power by alternating current (AC) electric power generation. The electricity meter includes a voltage sensor 206 and a current sensor 208 that are configured to measure the voltage and current of each of the three AC currents of the three phase electric power. The electricity meter can be configured to measure one or more additional values, for example, a neutral current. The electricity meter can include optional protection circuitry, e.g., circuit breakers, to shield the sensors from power spikes.

The voltage and current sensors are coupled to an input multiplexer 210. The voltage and current sensors provide voltage signals to the input multiplexer representing the voltage and current of each of the three AC currents. The electricity meter uses the input multiplexer to select a live input signal from among those signals and any other input signals for an analog to digital converter (ADC).

The ADC provides output digital values to an output multiplexer 214. The output multiplexer selects between the output digital values of the ADC and an expected live output value from a test management circuit 218. The test management circuit 218 can be the test management circuit 102 of FIG. 1. The selected value of the output multiplexer is provided to a digital signal processor (DSP) 216. The DSP can perform any of various actions, e.g., sending measurements to an electric power company server by a communications network, displaying measurements on a display of the electric meter, adjusting power usage at the consumer based on the measurements, and so on.

The test management circuit is configured to test the ADC as described above with reference to FIG. 1. The test management circuit can be configured based on a utility frequency of the three phase electric power. The utility frequency can be 50 Hz or 60 Hz, for example, and can change somewhat due to the combination of generation and load conditions on the electric power grid. The test management circuit can determine a testing time period for one of the phases based on when the amplitude of the phase will cross zero if the utility frequency does not change. The test management circuit can then determine the expected live output to be zero or closest to zero for that testing time period. Even if the utility frequency does change, the error can be negligible.

If the test management circuit determines that the ADC is not working properly, the DSP can perform various actions. For example, the DSP can send an alert message over a communications network, display an error message on a display of the electricity meter, and so on.

Example Testing Flowchart

Figure 3:
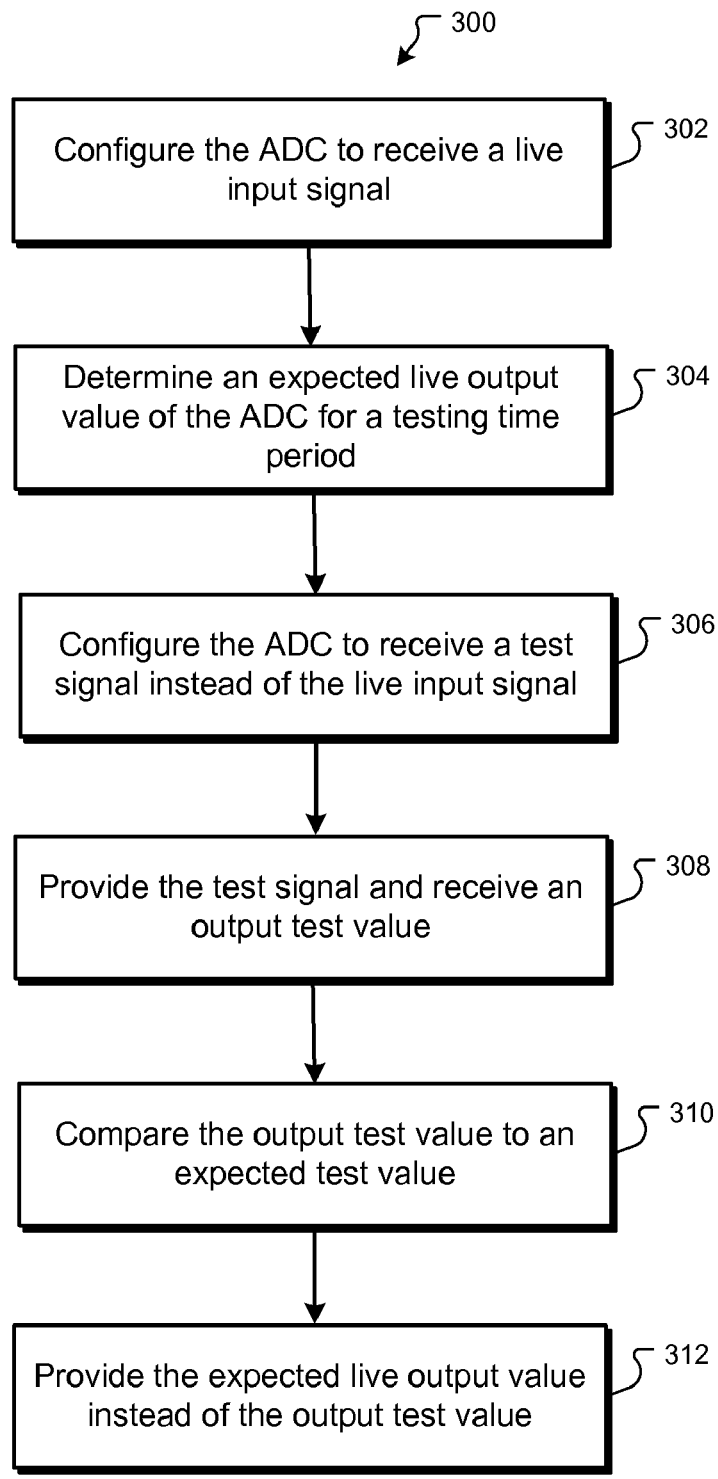
FIG. 3 is a flow diagram of an example process performed by a testing circuit for testing an analog to digital converter.

FIG. 3 is a flow diagram of an example process 300 performed by a testing circuit for testing an ADC. The testing circuit can be the testing circuit 100 of FIG. 1.

The testing circuit configures the ADC to receive a live input signal (step 302). The ADC provides a series of output digital values to a digital circuit. The digital circuit can be a digital signal processor.

The testing circuit determines an expected live output value of the ADC for a testing time period for the live input signal (step 304). For example, in some cases the live input signal varies at a live frequency, and determining the expected live output value for the testing time period comprises determining the expected live output value assuming that the live input signal will continue varying at the live frequency through the testing time period.

In some implementations, determining the expected live output value includes determining that the expected live output is closest to zero at a time when the amplitude of the live input signal will be closest to crossing zero if the live input signal continues varying at the live frequency. In some other implementations, determining the expected live output value includes applying an interpolation filter to the live input signal. If the live input signal is substantially band-limited to a maximum frequency, and the ADC is configured to sample the live input signal at a sampling frequency greater than or equal to twice the maximum frequency of the live input signal, the interpolation filter can precisely determine the expected live output value.

During the testing time period, the testing circuit configures the ADC to receive a test signal instead of the live input signal (step 306). For example, the testing circuit can apply a control signal to an input multiplexer coupled to the ADC.

The testing circuit provides the test signal to the ADC and receives an output test value from an output of the ADC (step 308). For example, the testing circuit can provide a reference voltage to the ADC.

The testing circuit compares the output test value to an expected test value (step 310). For example, the testing circuit can determine whether the output test value is equal to one of a range of values matched to the test signal. If the output test value is equal to one of a range of values matched to the test signal, the testing circuit determines that the ADC is working properly. If the output test value is not equal to any value in the range of values matched to the test signal, the testing circuit determines that the ADC is not working properly. The testing circuit can send an error message over a data communications network, or turn on an error indicator on the ADC.

The testing circuit provides the expected live output value to the digital circuit instead of the output test value (step 312). After the testing time period, the testing circuit can reconfigure the ADC to receive the live input signal.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method performed by a testing circuit for testing an analog to digital converter (ADC), the method comprising:
configuring the ADC to receive a live input signal and provide one or more output digital values to a digital circuit;
determining an expected live output value of the ADC for a testing time period for the live input signal;
during the testing time period:
configuring the ADC to receive a test signal instead of the live input signal;
providing the test signal to the ADC;
receiving an output test value from an output of the ADC;
comparing the output test value to an expected test value for the test signal; and
providing the expected live output value to the digital circuit instead of the output test value.

2. The method of claim 1, further comprising, after the testing time period, reconfiguring the ADC to receive the live input signal.

3. The method of claim 1, wherein the live input signal varies at a live frequency, and wherein determining the expected live output value for the testing time period comprises determining the expected live output value assuming that the live input signal will continue varying at the live frequency through the testing time period.

4. The method of claim 3, wherein determining the expected live output value comprises determining that the expected live output is zero at a time when the amplitude of the live input signal will be crossing zero if the live input signal continues varying at the live frequency.

5. The method of claim 3, wherein determining the expected live output value comprises applying an interpolation filter to the live input signal.

6. The method of claim 5, wherein the live input signal is substantially band-limited to a maximum frequency, and wherein the ADC is configured to sample the live input signal at a sampling frequency greater than or equal to twice the maximum frequency of the live input signal.

7. The method of claim 1, wherein the live input signal is based on a power signal at a utility frequency from an electric power grid, and wherein determining the expected live output value for the testing time period comprises:
determining based on the utility frequency a time when the amplitude of the power signal will be equal to zero as the amplitude of the power signal crosses from a positive value to a negative value or as the amplitude of the power signal crosses from a negative value to a positive value;
determining the time period as encompassing the time when the amplitude of the power signal will be equal to zero; and
determining that the expected live output value is zero.

8. A testing circuit for testing an analog to digital converter (ADC), the testing circuit comprising:
a test signal generator configured to generate a test signal, the test signal generator being coupled to an input of the ADC;
a test signal comparator configured to compare an output value of the ADC to an expected test output value for the test signal the test signal comparator being coupled to an output of the ADC; and
an expected value predictor configured to determine an expected live output value of the ADC for a testing time period;
wherein the testing circuit is configured to perform operations comprising:
during the testing time period, configuring the ADC to receive the test signal instead of a live input signal;
providing the test signal to the ADC;
receiving an output test value from an output of the ADC;
comparing the output test value to the expected test value for the test signal; and
providing the expected live output value to a digital circuit instead of the output test value.

9. The testing circuit of claim 7, further comprising an input circuit configured to select between the live input signal and the test signal and an output circuit configured to select between the output of the ADC and an expected live output of the testing circuit.

10. The testing circuit of claim 7, wherein determining the expected live output value for the testing time period comprises determining the expected live output value assuming that the live input signal will continue varying at a live frequency through the testing time period.

11. The testing circuit of claim 10, wherein determining the expected live output value comprises determining that the expected live output is zero at a time when the amplitude of the live input signal will be crossing zero if the live input signal continues varying at the live frequency.

12. The testing circuit of claim 10, wherein determining the expected live output value comprises applying interpolation to the live input signal.

13. The testing circuit of claim 12, wherein the live input signal is substantially band-limited to a maximum frequency, and wherein the ADC is configured to sample the live input signal at a sampling frequency greater than or equal to twice the maximum frequency of the live input signal.

14. An electricity meter comprising:
a live signal input;
a digital signal processor (DSP);
an analog to digital converter (ADC);
an input circuit coupled to the live signal input;
an output circuit coupled to an ADC output and the DSP; and
a test management circuit coupled to the input circuit and the output circuit, wherein the test management circuit is configured to perform operations comprising:
determining an expected live output value of the ADC for a testing time period for a live input signal on the live signal input;
during the testing time period, configuring the input circuit so that the ADC receives the test signal instead of a live input signal and configuring the output circuit so that the DSP receives the expected live output value instead of an output test value from the ADC;
providing the test signal to the ADC;
receiving an output test value from an output of the ADC; and comparing the output test value to the expected test value for the test signal.

15. The electricity meter of claim 14, wherein determining the expected live output value for the testing time period comprises determining the expected live output value assuming that the live input signal will continue varying at a live frequency through the testing time period.

16. The electricity meter of claim 15, wherein determining the expected live output value comprises determining that the expected live output is zero at a time when the amplitude of the live input signal will be crossing zero if the live input signal continues varying at the live frequency.

17. The electricity meter of claim 15, wherein determining the expected live output value comprises applying an interpolation filter to the live input signal.

18. The electricity meter of claim 15, wherein the live frequency is a utility frequency for an electric power grid.

* * * * *

UNITED STATES PATENT AND TRADEMARK OFFICE
CERTIFICATE OF CORRECTION

| | | |
|---|---|---|
| PATENT NO. | : 8,319,509 B1 | Page 1 of 1 |
| APPLICATION NO. | : 13/460006 | |
| DATED | : November 27, 2012 | |
| INVENTOR(S) | : Daniel Arthur Staver et al. | |

It is certified that error appears in the above-identified patent and that said Letters Patent is hereby corrected as shown below:

In the Claims:

Column 6, Line 8, In Claim 8, after the first instance of "signal" insert --,--.

Signed and Sealed this
Eighteenth Day of June, 2013

Teresa Stanek Rea
*Acting Director of the United States Patent and Trademark Office*